United States Patent
Meth et al.

(10) Patent No.: US 7,144,791 B2
(45) Date of Patent: Dec. 5, 2006

(54) LAMINATION THROUGH A MASK

(75) Inventors: Jeffrey Scott Meth, Landenberg, PA (US); Irina Malajovich, Swarthmore, PA (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 92 days.

(21) Appl. No.: 10/949,791

(22) Filed: Sep. 24, 2004

(65) Prior Publication Data

US 2005/0142813 A1 Jun. 30, 2005

Related U.S. Application Data

(60) Provisional application No. 60/506,686, filed on Sep. 26, 2003.

(51) Int. Cl.
*H01L 21/30* (2006.01)

(52) U.S. Cl. ............. 438/457; 438/458; 438/975; 438/942; 438/460; 257/E21.215; 257/E21.235

(58) Field of Classification Search ........... 438/457, 438/458, 942, 975
See application file for complete search history.

(56) References Cited

U.S. PATENT DOCUMENTS 3,226,255 A * 12/1965 Cieniewicz et al. ........ 438/758
4,556,627 A * 12/1985 Sullivan ..................... 430/312
6,077,634 A *  6/2000 Phillips ........................ 430/7

FOREIGN PATENT DOCUMENTS

DE    44 40 762     4/1996
JP    2001-135734   5/2001
JP    2001-196589   7/2001

* cited by examiner

Primary Examiner—Michael Lebentritt
Assistant Examiner—Kyoung Lee

(57) ABSTRACT

The present invention is a process for transfer of a pattern of material from a donor substrate to a receiver substrate by lamination. The pattern of the transferred material is defined by an aperture in a mask interposed between the donor and receiver during lamination. The technique is compatible with flexible polymer receiver substrates and is useful in fabricating thin film transistors for flexible displays.

3 Claims, 7 Drawing Sheets

LAMINATION THROUGH A MASK

FIELD OF THE INVENTION

The present invention relates to a process for deposition of patterned materials by lamination through a mask. The process is particularly useful for constituents of thin film transistors or other electronic devices. In the process, a layer of deposited material is laminated from a donor substrate through a mask on to the device. The use of the mask limits the deposition of the laminated layer to areas where it is desired. The technique is especially useful in the deposition of gate dielectrics over gate electrodes in thin film field effect transistors.

TECHNICAL BACKGROUND OF THE INVENTION

Baek et al (U.S. Pat. No. 6,493,048) disclose a manufacturing method for liquid crystal displays using a photoresist pattern as an etch mask.

Taku and Masaharu (JP2001135734) disclose a method for patterning ferroelectric material in the thin film field effect transistor involving anisotropic etching.

Takatoshi and Takashi (JP2001196589) disclose a manufacturing method of thin film transistors. The method involves etching.

In contrast, the present invention forms patterned layers of materials by using a lamination process involving pressing a layer of material deposited on a donor substrate through a mask to develop the pattern on to a receiver substrate.

SUMMARY OF THE INVENTION

This invention describes a process comprising:
a) depositing a material on a side of a donor substrate
b) aligning a mask with an aperture between the donor substrate and a receiver substrate such that the aperture of the mask is in the desired position relative to the receiver substrate
c) laminating the donor substrate oriented with the side with the deposited material towards the mask and the receiver substrate, the mask, and the receiver substrate such that the deposited material is transferred through the aperture of the mask on to the receiver substrate, and
d) removing the donor substrate and the mask.

The present invention also includes a process comprising:
a) depositing a release layer on a side of a donor substrate
b) depositing a material on the release layer
c) aligning a mask with an aperture between the donor substrate and a receiver substrate such that the aperture of the mask is in the desired position relative to the receiver substrate
d) laminating the donor substrate oriented with the side with the deposited material towards the mask and the receiver substrate, the mask, and the receiver substrate such that the deposited material is transferred through the aperture of the mask on to the receiver substrate, and
e) removing the donor substrate and the mask.

DETAILED DESCRIPTION

Figure 1:
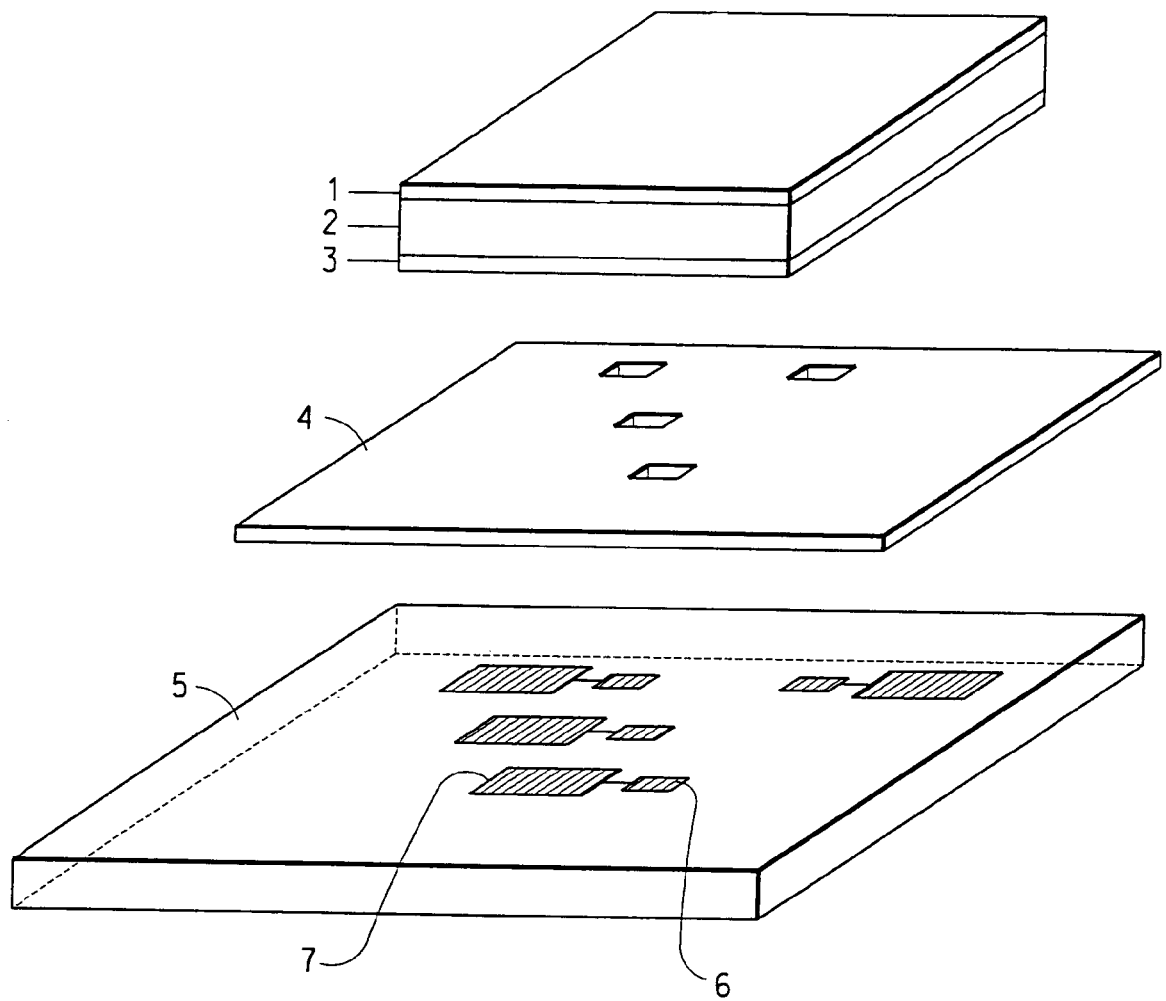
FIG. 1 is an example of lamination through a mask, where a patterned dilectric layer is added to a device being constructed. The mask is placed between the donor sheet and the device being built.

The present invention is a process for the transfer on material from a donor substrate to a receiver substrate by lamination in the form of a pattern. The pattern is obtained by placing a mask with an aperture between the donor substrate and the receiver substrate during lamination.

Material can be coated on a donor substrate by a variety of known processes such as spin coating a solution, drop casting a solution or evaporation deposition and condensation on the donor substrate. The donor substrate is relatively inert to the deposited material and is conveniently a polymer sheet or film of materials such as Teflon®, Mylar®, Kapton® or similar materials. The donor substrate can be a multilayered film, where layers are engineered to release the material to be laminated and/or to add conformal coverage through the shadow mask. For example, Elvax® can be plant coated roll-to-roll in a web coater onto Mylar® and used as a donor substrate. The material to be laminated is then deposited on the Elvax®), which adds both conformal coverage and ease of release from the donor substrate, since Elvax®) is elastomer-like and adhesion to Elvax® at elevated temperatures is poor.

The receiver may be already patterned with other elements of a device. The process of the present invention is conveniently used with flexible polymer receiver substrates, which can also be engineered to maximize adhesion of the material to be laminated. The lamination process is frequently carried out at slightly elevated temperatures, i.e. 80; to 120° C. These temperatures are consistent with the use of flexible polymer receiver substrates, which cannot tolerate extreme temperatures. The process of the present invention is particularly useful in the fabrication of thin film transistors on flexible polymer substrates. Low cost techniques are sought where large areas of polymer sheets can be fabricated with thin film transistors for use as drivers for flexible displays, sensors, etc. The use of low cost procedures, such as lamination processes, avoids the necessity of introducing the flexible polymer receiver substrate into a vacuum chamber. Additionally, lamination is a dried additive process that simplifies the construction of organic electronics by removing solvent compatibility issues.

Once the donor substrate is coated, it is placed with the side with the coated material toward the receiver. A mask with an aperture is aligned between the donor and receiver substrates. The aperture may be positioned above pre-existing features on the receiver substrate. For example, if the coated material is a gate dielectric material, the aperture of the mask may be positioned above a gate electrode structure already deposited on the receiver substrate. The aperture limits the coverage of material transferred from the donor to the receiver and thus defines a pattern to be formed in the transferred material. The mask is conveniently an inert flat sheet or film of materials such as Teflon, Mylar, Kapton or similar materials. Metal or ceramic masks could also be used.

Once the donor, mask and receiver are positioned, the elements are pressed together at a desired temperature in a lamination process. The temperature may be selected to soften one of the layers to allow adhesion. Under pressure, the material coated on the donor is pressed through the aperture in the mask to contact the receiver substrate. Only the material in the area defined by the aperture of the mask contacts the receiver. The receiver or donor substrates can be engineered to maximize contact between donor and receiver across the mask. Thus a pattern defined by the area of the aperture in the mask is formed. Under appropriate pressure and time conditions, the material above the aperture of the mask transfers to the receiver. After lamination, the donor substrate and the mask are removed leaving a pattern of the transferred material on the receiver in the pattern defined by the aperture of the mask.

The process is illustrated schematically in FIG. 1 where the donor substrate is Mylar (1). An elastomer-like release layer of Elvax or PDMS (2) is also illustrated. A dielectric is deposited on the release layer (3). The receiver substrate (5) is patterned, in this illustration, with gate electrode contacts (6) and (7). The receiver substrate (5) may be glass with ITO, Mylar with nickel, Kapton with Cu or Au in SiO$_2$. The mask (4) contains apertures and is positioned between the donor (1) and receiver (5) such that the apertures align with the gate electrodes.

Figure 2:
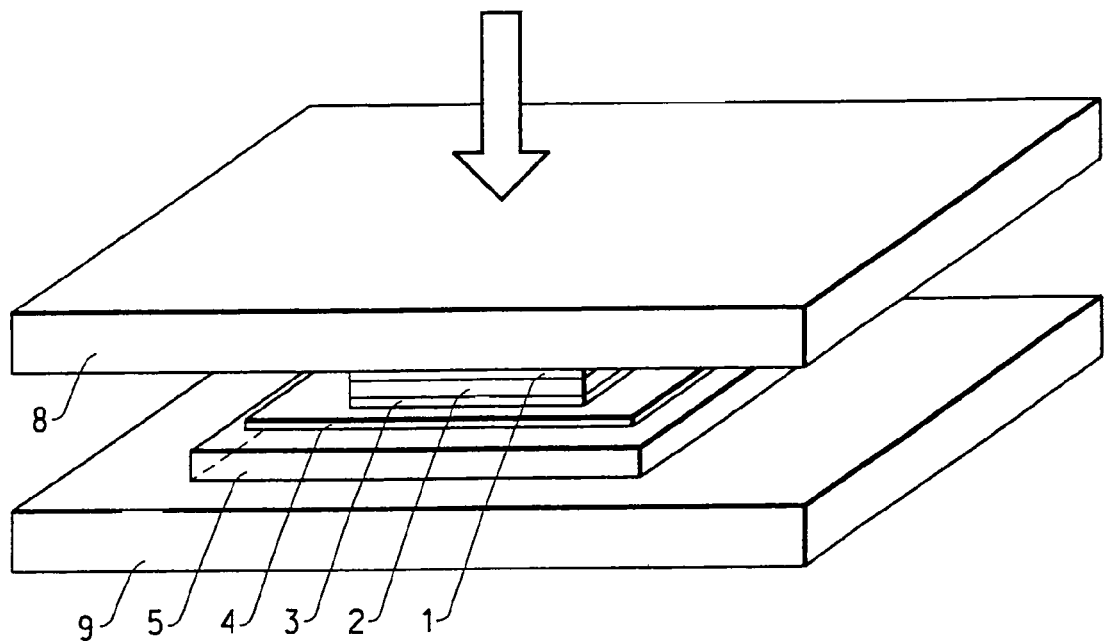
FIG. 2 shows the donor being pressed though the mask in a laminator.

FIG. 2 shows the lamination process of the donor. Shown are the donor layers (1), (2) and (3), mask (4) and receiver (5) in a lamination press (8) and (9). When the layers are pressed (and optionally heated), the elastomer expands above the apertures in the mask (4) to create a conformal coverage of the dielectric that is to be transferred.

Figure 3:
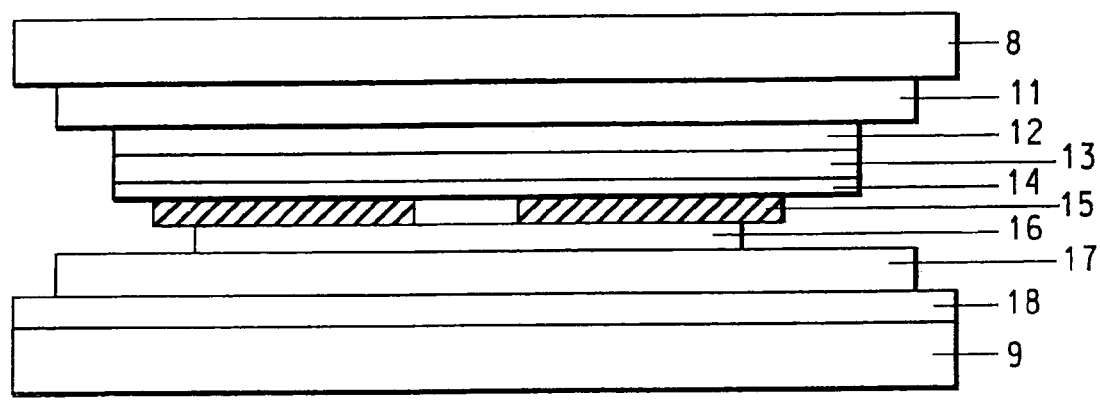
FIG. 3 shows the presence of an elastomeric layer allowing dielectric to be pressed across the mask onto a device being built.

FIG. 3 shows a cross section of the layers during the lamination process. If necessary, the layers are allowed to cool down.

Figure 4:
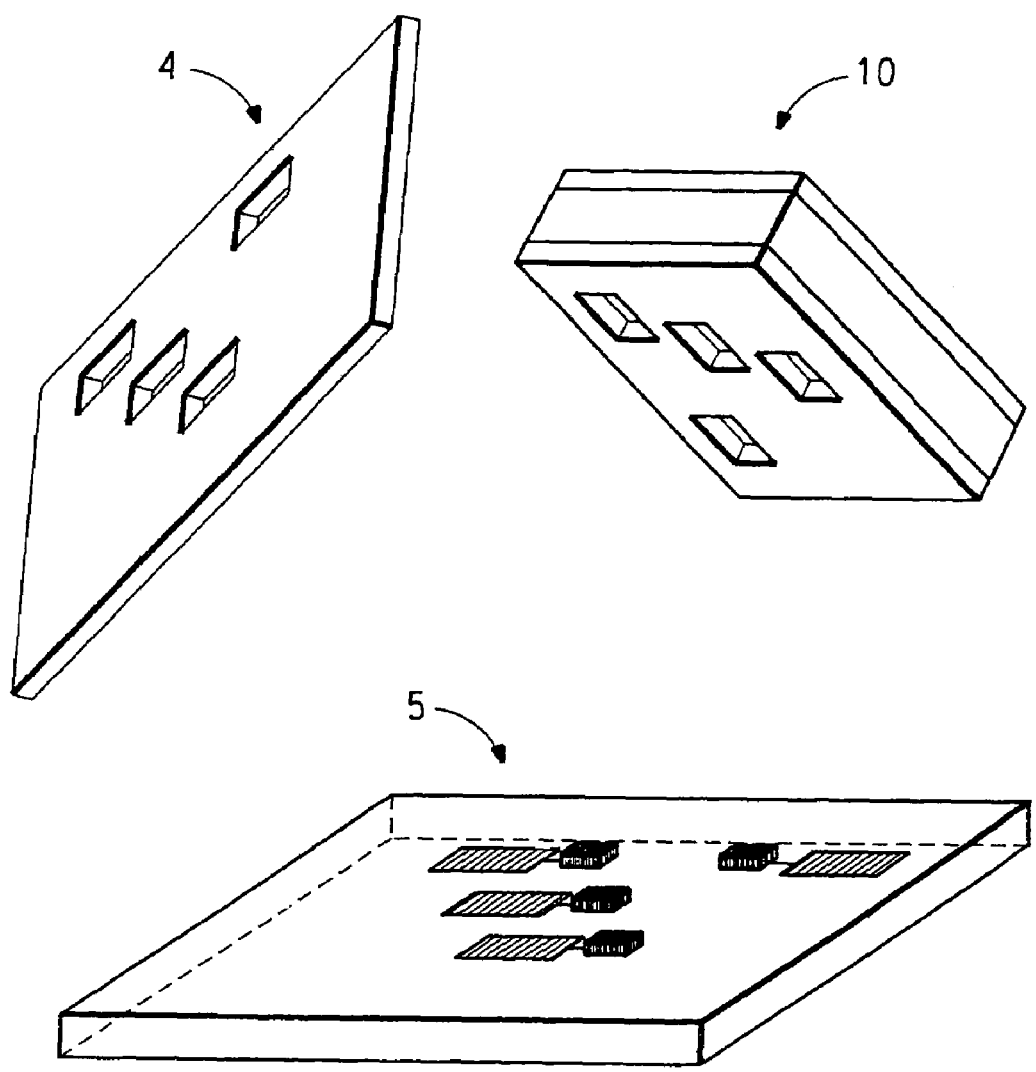
FIG. 4 shows the removal of the mask and donor layer.

FIG. 4 illustrates the disassembly of the layers after the lamination process. Once the layers are at the desired temperature, the mask (4) and donor sheet (10) are removed. Only the material from the donor sheet aligned with the apertures in the mask remains on the receiver substrate (5). In the illustration shown, the patterned dielectric leaves gate electrode contacts accessible for either input or output connections or for interconnects or vias to other layers of an electronic device. The interface chemistry is such that the dielectric layer to be transferred is easily released from the elastomer-like release layer and binds to the device being built. Additionally, materials may be selected where the dielectric does not bind to the mask. This allows for multiple use of the mask (4) without cleaning.

This method does not require time consuming and expensive techniques such as lithography or vacuum evaporation. The process takes only a few minutes and the size of the area patterned with this process is limited only by the size of the lamination press. This process can take advantage of developments in the chemistry of elastomer stamps without the actual use of stamps which are expensive to fabricate and prone to collapse after one or two uses. Stamps are also usually limited to small areas.

The mask could be used for a very large number of laminations. This technique can also use the advances in "dry-liftoff" processes without the use of expensive evaporation techniques. Furthermore, more than one layer can be transferred through the mask at once. For example, a semiconductor and a dielectric could be transferred at the same time. In that case, the dielectric can serve to protect the semiconductor from degradation by exposure to air.

EXAMPLES

Example 1

Figure 5:
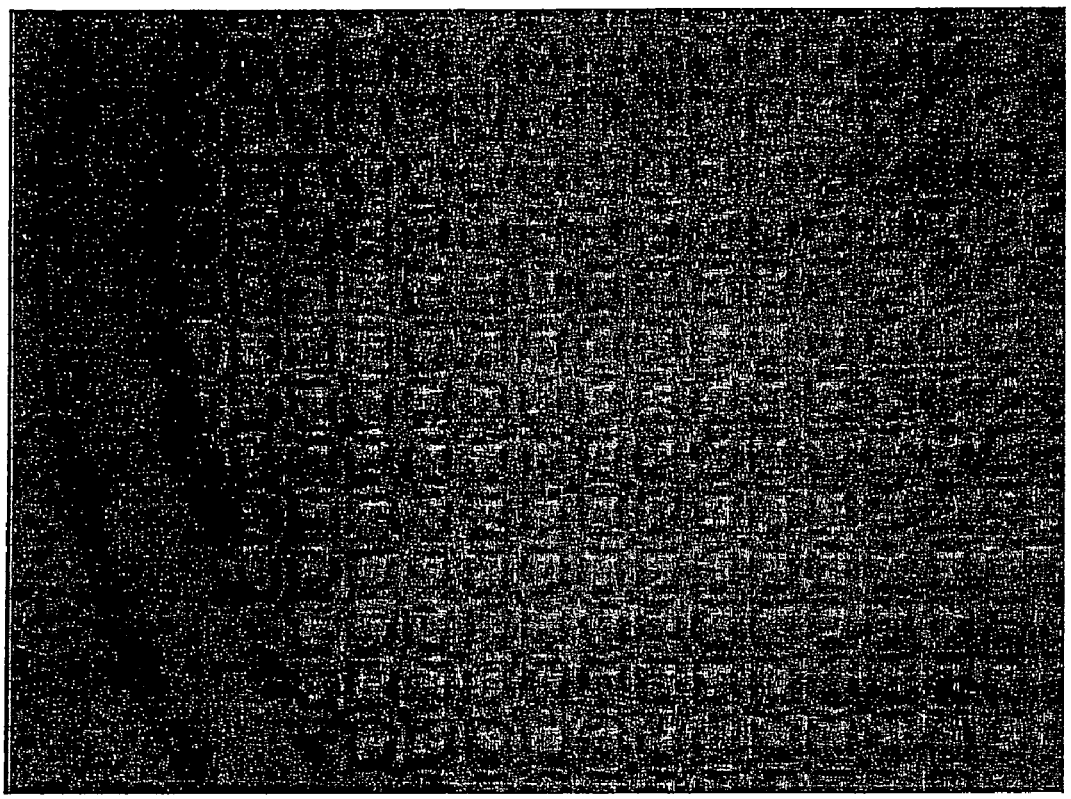
FIG. 5 shows a photograph of mask-lamination of 420 nm of pvp dielectric onto ITO-glass using a TEM 200 grid as a mask.
Figure 6:
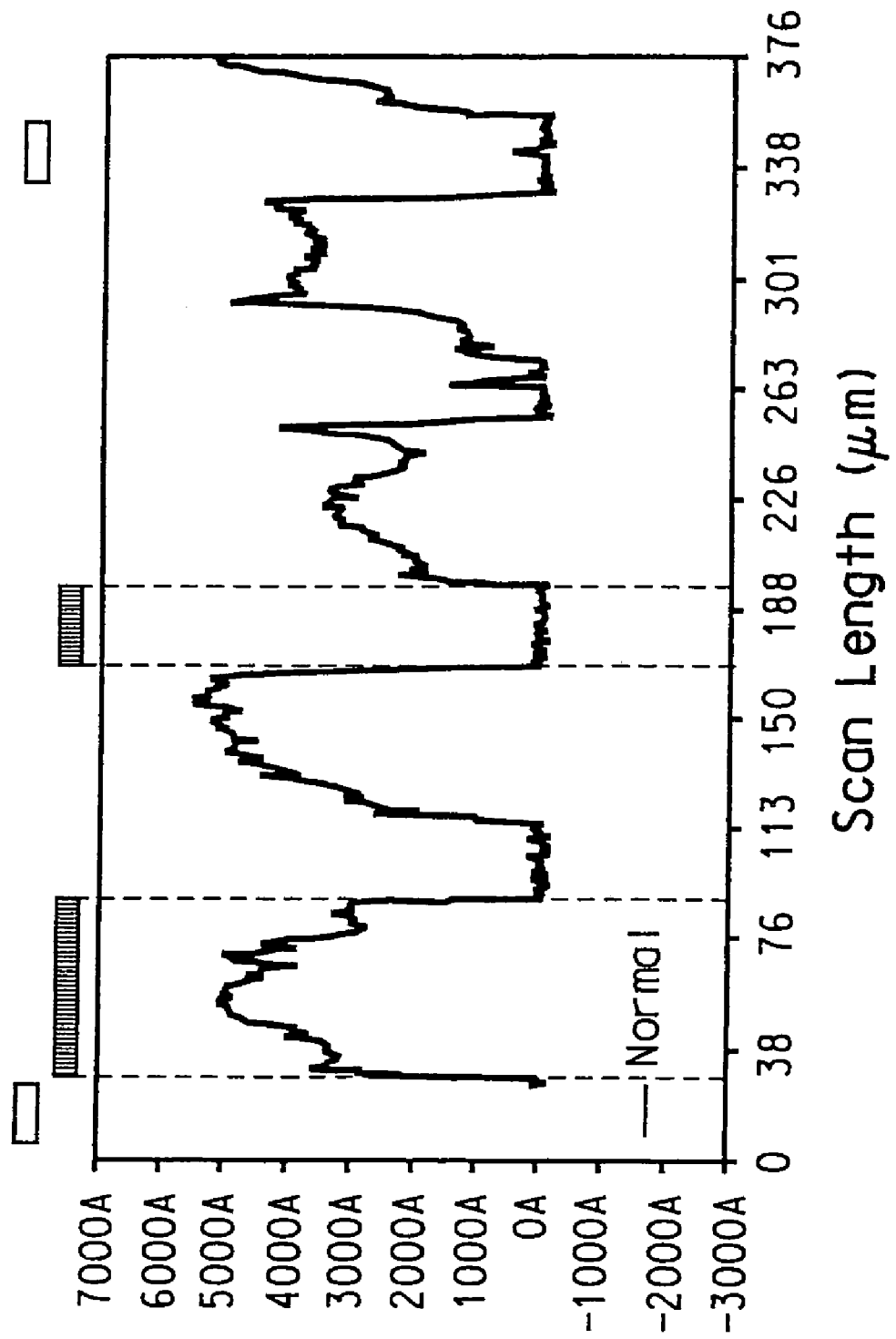
FIG. 6 shows a cross section scan of Figure a) showing how the patterned dielectric directly reproduces the mask, which has squared holes of 58 µm and wires of 25 µm.

This example describes how a dielectric can be patterned by lamination through a mask. The substrate is a glass slide. The dielectric is 420 nm poly-vinyl pyrridine bar coated from a solvent solution onto Mylar with Elvax coating. A Transmission Electron Microscope (TEM) grid was used as a mask to pattern the dielectric during lamination. The TEM 200 Cu grid used had square holes measuring 58 microns on a side and 25 micron diameter lines. Lamination was performed on a Carver 3889 press-laminator, under a force of 10 klb and a temperature of 85° C. FIG. 5 shows an optical microscope image of the pattern of poly-vinyl pyrridine transferred onto ITO-coated glass using the process of the present invention. FIG. 6 shows the profile of the structure shown in FIG. 5, taken using a Tencor P.15 profilometer.

Example 2

Figure 7:
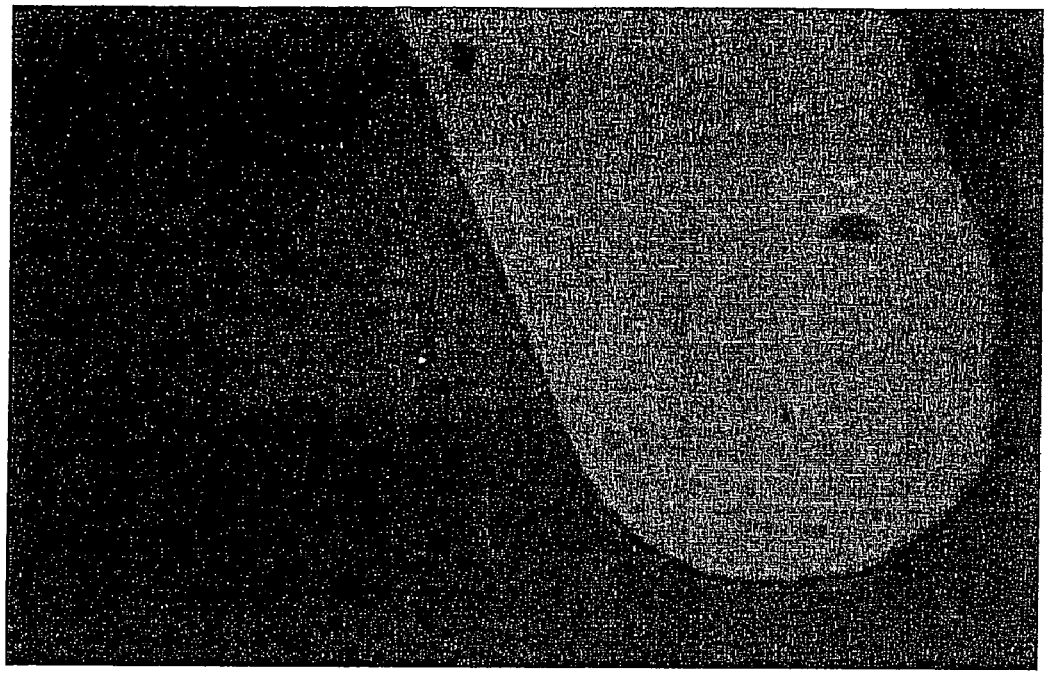
FIG. 7 shows a conducting Ni pattern mask-laminated onto glass using Ni-mylar coated with p-vp and a TEM single slot grid.
Figure 8:
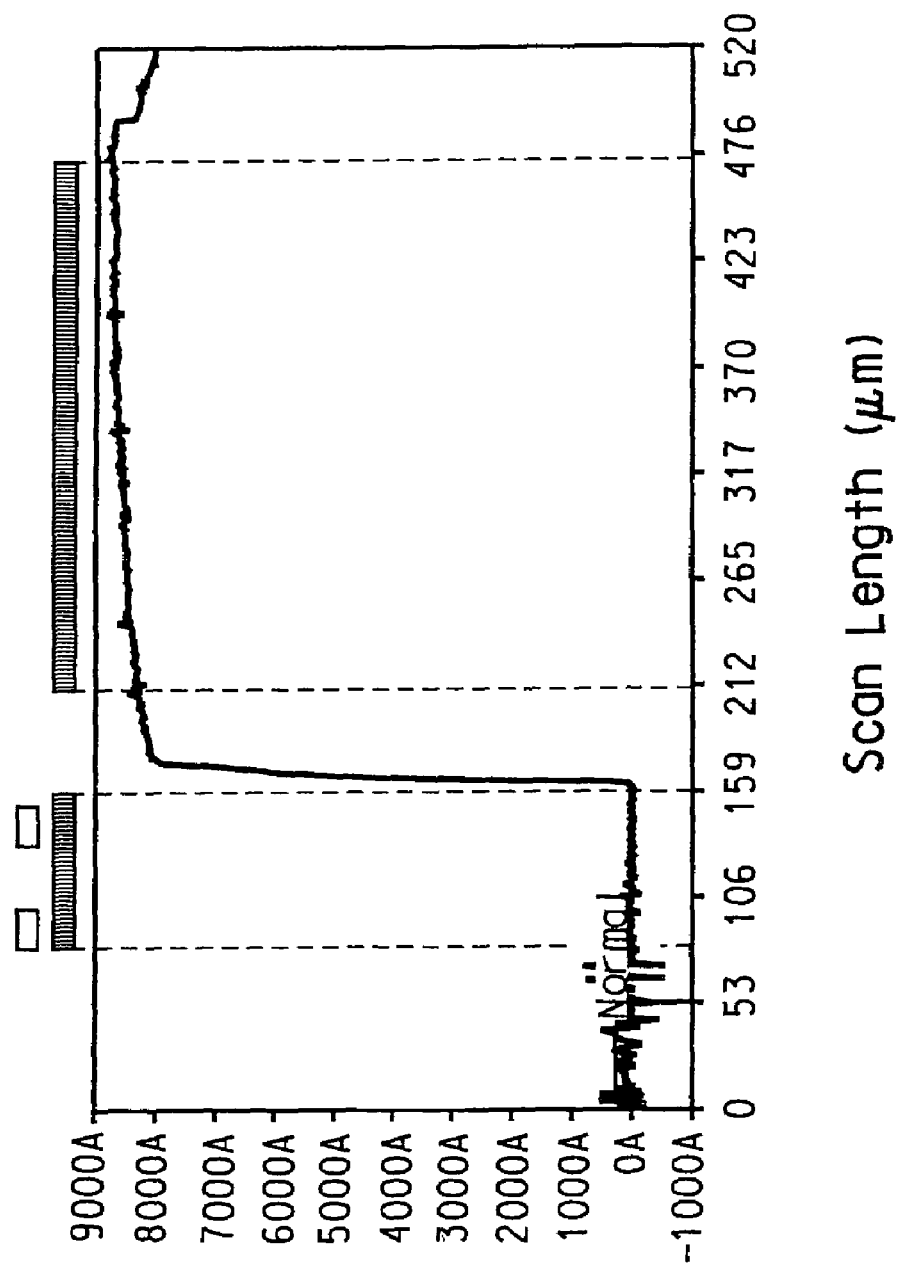
FIG. 8 shows a crossectional profile of a Ni contact edge as shown in FIG. 7.

This example describes how a conductor can be patterned by lamination through a mask. The substrate is a glass slide. The conductor is 7 nm of Ni coated with a dielectric, 420 nm thick poly-vinyl pyrridine. The dielectric is deposited on a Mylar donor substrate. The nickel is deposited on the dielectric. As in Example 1 above, a TEM grid was used as a mask to pattern the dielectric during lamination. Lamination was performed on a plate-laminator under a force of 10 klb and a temperature of 85° C. During lamination, both the dielectric and the conductor are transferred. The dielectric is transferred directly onto the glass. The Ni lies above the dielectric on the exposed surface. The result is a patterned conductor on the glass slide, separated by a dielectric layer. FIG. 7 shows an image of a region of nickel deposited by the process of the present invention. FIG. 8 the profile of the structure shown in FIG. 7, taken using a Tencor P.15 profilometer.

What is claimed is:

1. A process comprising:
   (a) depositing a material selected from a dielectric, semiconductor, conductor and combinations thereof on a dide of a donor substrate;
   (b) aligning a mask with an aperture between the donor substrate and a receiver substrate such that the aperture of the mask is in the desired position relative to the receiver substrate;
   (c) laminating the donor substrate oriented with the side with the deposited material towards the mask and the receiver substrate, the mask, and the receiver substrate such that the deposited material is transferred through the aperture of the mask on to the receiver substrate; and (d) removing the donor substrate and the mask.

2. A process comprising:

a) depositing a release layer or a conformal layer on a side of a donor substrate;

b) depositing a material selected from a dielectric, semiconductor, conductor and combinations thereof on the release layer;

c) aligning a mask with an aperture between the donor substrate and a receiver substrate such that the aperture of the mask is in the desired position relative to the receiver substrate;

d) laminating the donor substrate oriented with the side with the deposited material towards the mask and the receiver substrate, the mask, and the receiver substrate such that the deposited material is transferred through the aperture of the mask on to the receiver substrate; and e) removing the donor substrate and the mask.

3. The process of claim 1 or claim 2 when the donor substrate is a polymer sheet or film.

* * * * *

UNITED STATES PATENT AND TRADEMARK OFFICE
CERTIFICATE OF CORRECTION

| | |
|---|---|
| PATENT NO. | : 7,144,791 B2 |
| APPLICATION NO. | : 10/949791 |
| DATED | : December 5, 2006 |
| INVENTOR(S) | : Jeffrey Scott Meth and Irina Malajovich |

It is certified that error appears in the above-identified patent and that said Letters Patent is hereby corrected as shown below:

Col. 4, line 59; "dide" should read --side--

Signed and Sealed this

Twentieth Day of March, 2007

JON W. DUDAS
*Director of the United States Patent and Trademark Office*